(12) United States Patent
Roy

(10) Patent No.: US 8,994,415 B1
(45) Date of Patent: Mar. 31, 2015

(54) MULTIPLE VDD CLOCK BUFFER

(71) Applicant: SuVolta, Inc., Los Gatos, CA (US)

(72) Inventor: Richard S. Roy, Dublin, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 13/783,167

(22) Filed: Mar. 1, 2013

(51) Int. Cl.
*H03B 1/00* (2006.01)
*H03K 3/00* (2006.01)
*H03K 5/05* (2006.01)

(52) U.S. Cl.
CPC .......................................... *H03K 5/05* (2013.01)
USPC ........................................... 327/112; 327/108

(58) Field of Classification Search
CPC ................... H03K 19/00315; H03K 19/00361; H03K 19/0013; H03K 19/018521; H03K 19/018585
USPC ................................................... 327/108, 112
See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,578,128 A | 3/1986 | Mundt et al. | |
| 4,617,066 A | 10/1986 | Vasudev | |
| 4,761,384 A | 8/1988 | Neppl et al. | |
| 4,819,043 A | 4/1989 | Yazawa et al. | |
| 5,034,337 A | 7/1991 | Mosher et al. | |
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |
| 5,208,473 A | 5/1993 | Komori et al. | |
| 5,298,763 A | 3/1994 | Shen et al. | |
| 5,369,288 A | 11/1994 | Usuki | |
| 5,384,476 A | 1/1995 | Nishizawa et al. | |
| 5,559,368 A | 9/1996 | Hu et al. | |

(Continued)

FOREIGN PATENT DOCUMENTS

EP  0274278 A1  7/1988
JP  59-193066 A  11/1984

(Continued)

OTHER PUBLICATIONS

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, pp. 23-24, 1995.

(Continued)

*Primary Examiner* — Diana J Cheng
(74) *Attorney, Agent, or Firm* — Darryl G. Walker

(57) ABSTRACT

A clock buffer circuit can include a low voltage drive circuit that receives a clock signal and provides a low voltage drive at a first power supply potential to a load. A boost drive circuit can provide a high voltage drive at a second power supply potential greater than the first power supply potential to the load. The boost drive circuit can provide the high voltage drive in response to a pulse signal generated in response to a transition of a clock input signal. A pulse generator circuit may generate the pulse signal to have a predetermined width to enable the high voltage drive until the load is charged essentially to the first power supply potential.

20 Claims, 8 Drawing Sheets

(56) References Cited

U.S. PATENT DOCUMENTS

| | | |
|---|---|---|
| 5,608,253 A | 3/1997 | Liu et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,780,899 A | 7/1998 | Hu et al. |
| 5,847,419 A | 12/1998 | Imai et al. |
| 5,850,157 A | 12/1998 | Zhu et al. |
| 5,856,003 A | 1/1999 | Chiu |
| 5,861,334 A | 1/1999 | Rho |
| 5,877,049 A | 3/1999 | Liu et al. |
| 5,889,315 A | 3/1999 | Farrenkopf et al. |
| 5,895,954 A | 4/1999 | Yasumura et al. |
| 5,923,987 A | 7/1999 | Burr |
| 5,989,963 A | 11/1999 | Luning et al. |
| 6,020,227 A | 2/2000 | Bulucea |
| 6,087,210 A | 7/2000 | Sohn |
| 6,087,691 A | 7/2000 | Hamamoto |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,218,895 B1 | 4/2001 | De et al. |
| 6,229,188 B1 | 5/2001 | Aoki et al. |
| 6,245,618 B1 | 6/2001 | An et al. |
| 6,288,429 B1 | 9/2001 | Iwata et al. |
| 6,300,177 B1 | 10/2001 | Sundaresan et al. |
| 6,313,489 B1 | 11/2001 | Letavic et al. |
| 6,320,222 B1 | 11/2001 | Forbes et al. |
| 6,326,666 B1 | 12/2001 | Bernstein et al. |
| 6,358,806 B1 | 3/2002 | Puchner |
| 6,366,124 B1 * | 4/2002 | Kwong .......................... 326/81 |
| 6,380,019 B1 | 4/2002 | Yu et al. |
| 6,391,752 B1 | 5/2002 | Colinge et al. |
| 6,426,279 B1 | 7/2002 | Huster et al. |
| 6,444,550 B1 | 9/2002 | Hao et al. |
| 6,444,551 B1 | 9/2002 | Ku et al. |
| 6,461,920 B1 | 10/2002 | Shirahata et al. |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,506,640 B1 | 1/2003 | Ishida et al. |
| 6,518,623 B1 | 2/2003 | Oda et al. |
| 6,534,373 B1 | 3/2003 | Yu |
| 6,541,829 B2 | 4/2003 | Nishinohara et al. |
| 6,548,842 B1 | 4/2003 | Bulucea et al. |
| 6,551,885 B1 | 4/2003 | Yu |
| 6,573,129 B2 | 6/2003 | Hoke et al. |
| 6,600,200 B1 | 7/2003 | Lustig et al. |
| 6,620,671 B1 | 9/2003 | Wang et al. |
| 6,624,488 B1 | 9/2003 | Kim |
| 6,630,710 B1 | 10/2003 | Augusto |
| 6,657,474 B2 | 12/2003 | Varadarajan |
| 6,660,605 B1 | 12/2003 | Liu |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,753,230 B2 | 6/2004 | Sohn et al. |
| 6,770,944 B2 | 8/2004 | Nishinohara et al. |
| 6,787,424 B1 | 9/2004 | Yu |
| 6,797,994 B1 | 9/2004 | Hoke et al. |
| 6,808,994 B1 | 10/2004 | Wang |
| 6,821,825 B2 | 11/2004 | Todd et al. |
| 6,822,297 B2 | 11/2004 | Nandakumar et al. |
| 6,831,292 B2 | 12/2004 | Currie et al. |
| 6,881,641 B2 | 4/2005 | Wieczorek et al. |
| 6,881,987 B2 | 4/2005 | Sohn |
| 6,893,947 B2 | 5/2005 | Martinez et al. |
| 6,916,698 B2 | 7/2005 | Mocuta et al. |
| 6,930,007 B2 | 8/2005 | Bu et al. |
| 6,930,360 B2 | 8/2005 | Yamauchi et al. |
| 6,963,090 B2 | 11/2005 | Passlack et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,515 B2 | 8/2006 | Hanafi et al. |
| 7,119,381 B2 | 10/2006 | Passlack |
| 7,126,406 B2 | 10/2006 | Vadi et al. |
| 7,170,120 B2 | 1/2007 | Datta et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,235,822 B2 | 6/2007 | Li |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,427,788 B2 | 9/2008 | Li et al. |
| 7,442,971 B2 | 10/2008 | Wirbeleit et al. |
| 7,462,908 B2 | 12/2008 | Bol et al. |
| 7,485,536 B2 | 2/2009 | Jin et al. |
| 7,486,126 B2 | 2/2009 | Shimazaki |
| 7,491,988 B2 | 2/2009 | Tolchinsky et al. |
| 7,494,861 B2 | 2/2009 | Chu et al. |
| 7,498,637 B2 | 3/2009 | Yamaoka et al. |
| 7,501,324 B2 | 3/2009 | Babcock et al. |
| 7,507,999 B2 | 3/2009 | Kusumoto et al. |
| 7,521,323 B2 | 4/2009 | Surdeanu et al. |
| 7,531,393 B2 | 5/2009 | Doyle et al. |
| 7,538,412 B2 | 5/2009 | Schulze et al. |
| 7,564,105 B2 | 7/2009 | Chi et al. |
| 7,592,241 B2 | 9/2009 | Takao |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chiu |
| 7,615,802 B2 | 11/2009 | Elpelt et al. |
| 7,622,341 B2 | 11/2009 | Chudzik et al. |
| 7,642,140 B2 | 1/2010 | Bae et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,675,126 B2 | 3/2010 | Cho |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,750,405 B2 | 7/2010 | Nowak |

(56) References Cited

U.S. PATENT DOCUMENTS

| | | | |
|---|---|---|---|
| 7,750,682 B2 | 7/2010 | Bernstein et al. |
| 7,755,146 B2 | 7/2010 | Helm et al. |
| 7,759,714 B2 | 7/2010 | Itoh et al. |
| 7,759,973 B1 | 7/2010 | Vadi et al. |
| 7,795,677 B2 | 9/2010 | Bangsaruntip et al. |
| 7,818,702 B2 | 10/2010 | Mandelman et al. |
| 7,829,402 B2 | 11/2010 | Matocha et al. |
| 7,867,835 B2 | 1/2011 | Lee et al. |
| 7,870,414 B2 | 1/2011 | Koo |
| 7,883,977 B2 | 2/2011 | Babcock et al. |
| 7,888,747 B2 | 2/2011 | Hokazono |
| 7,897,495 B2 | 3/2011 | Ye et al. |
| 7,906,413 B2 | 3/2011 | Cardone et al. |
| 7,906,813 B2 | 3/2011 | Kato |
| 7,919,791 B2 | 4/2011 | Flynn et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 8,004,024 B2 | 8/2011 | Furukawa et al. |
| 8,012,827 B2 | 9/2011 | Yu et al. |
| 8,039,332 B2 | 10/2011 | Bernard et al. |
| 8,048,791 B2 | 11/2011 | Hargrove et al. |
| 8,048,810 B2 | 11/2011 | Tsai et al. |
| 8,067,279 B2 | 11/2011 | Sadra et al. |
| 8,074,190 B1 | 12/2011 | Li et al. |
| 8,105,891 B2 | 1/2012 | Yeh et al. |
| 8,106,424 B2 | 1/2012 | Schruefer |
| 8,106,481 B2 | 1/2012 | Rao |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,173,502 B2 | 5/2012 | Yan et al. |
| 8,178,430 B2 | 5/2012 | Kim et al. |
| 8,183,096 B2 | 5/2012 | Wirbeleit |
| 8,183,107 B2 | 5/2012 | Mathur et al. |
| 8,236,661 B2 | 8/2012 | Dennard et al. |
| 8,327,158 B2 | 12/2012 | Titiano et al. |
| 8,427,213 B2 | 4/2013 | Lewis et al. |
| 2001/0014495 A1 | 8/2001 | Yu |
| 2003/0122203 A1 | 7/2003 | Nishinohara et al. |
| 2003/0183856 A1 | 10/2003 | Wieczorek et al. |
| 2004/0075118 A1 | 4/2004 | Heinemann et al. |
| 2004/0084731 A1 | 5/2004 | Matsuda et al. |
| 2005/0116282 A1 | 6/2005 | Pattanayak et al. |
| 2005/0250289 A1 | 11/2005 | Babcock et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2007/0040222 A1 | 2/2007 | Van Camp et al. |
| 2007/0158790 A1 | 7/2007 | Rao |
| 2007/0238253 A1 | 10/2007 | Tucker |
| 2008/0067589 A1 | 3/2008 | Ito et al. |
| 2008/0169493 A1 | 7/2008 | Lee et al. |
| 2008/0197439 A1 | 8/2008 | Goerlach et al. |
| 2008/0227250 A1 | 9/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0302388 A1 | 12/2009 | Cai et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0053243 A1* | 3/2010 | Yamaguchi et al. ............ 347/10 |
| 2010/0187641 A1 | 7/2010 | Zhu et al. |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2012/0021594 A1 | 1/2012 | Gurtei et al. |
| 2012/0056275 A1 | 3/2012 | Cai et al. |
| 2012/0108050 A1 | 5/2012 | Chen et al. |
| 2012/0190177 A1 | 7/2012 | Kim et al. |

FOREIGN PATENT DOCUMENTS

| | | |
|---|---|---|
| JP | 4-186774 A | 7/1992 |
| JP | 8-153873 A | 6/1996 |
| JP | 8-288508 A | 11/1996 |
| JP | 2004087671 A | 3/2004 |
| WO | 2011/062788 A1 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-µm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

(56) References Cited

OTHER PUBLICATIONS

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

\* cited by examiner

MULTIPLE VDD CLOCK BUFFER

TECHNICAL FIELD

The present invention relates generally to clock buffers, and more particularly to clock buffer circuits operating at low voltages.

BACKGROUND OF THE INVENTION

Many semiconductor devices operate using a clock signal. This clock signal must be distributed throughout the device with as little skew as possible. One way to reduce skew is through a clock tree.

Referring now to FIG. 1, a conventional clock tree is set forth in a schematic diagram and designated by the general reference character 100. Clock tree 100 has a clock input at beginning point 140. The clock signal may be buffered by buffer circuits 110 at each T-junction 120 before being provided to circuitry at the tree ends 150. To avoid unduly cluttering the figure, buffer circuits 110 are only shown at various T-junctions 120 to illustrate a complete propagation path of a clock signal to an endpoint 150. However, it is understood that buffer circuits 110 are provided on each side of a T-junction 120. Clock tree 100 is designed such that the propagation path of a clock signal from beginning point 140 to each endpoint 150 are essentially matching. Furthermore, the delay of each buffer circuit 110 must be small to minimize the clock insertion delay from beginning point 140 to each endpoint 150.

Each buffer circuit 110 can essentially be a pair of inverters. Referring now to FIG. 2, a conventional buffer circuit is set forth in a circuit schematic diagram and designated by the general reference character 200. Conventional buffer circuit may receive a clock signal CLKIN at terminal 210 and may provide a clock signal CLKOUT at terminal 220. Buffer circuit 200 may be used as buffer circuit 110 in clock tree 100 of FIG. 1.

Buffer circuit 200 may include inverters (INV202 and INV204). Load network L202 is shown to essentially model the load of the conductive branches in the tree network of FIG. 1.

Inverter INV202 receives clock signal CLKIN at input terminal 210 and provides an output at node N212. Inverter INV204 has an input connected to node N212 and provides an output at node N214. Load L202 is connected between node N214 and output terminal 220. Input terminal 210 can be a T-junction 120 in clock tree 100 of FIG. 1 where a buffer circuit 110 and output terminal 220 can be a subsequent T-junction 120 where the next buffer circuit 110 is located.

Inverter INV202 is a complementary metal oxide semiconductor (CMOS) inverter including an n-channel metal oxide semiconductor field effect transistor (MOSFET) N202 and p-channel MOSFET P202. N-channel MOSFET N202 has a gate terminal connected to input terminal 210, a source terminal connected to ground VSS, a drain terminal connected to node N212, and a body terminal connected to receive a back bias potential Vbn. P-channel MOSFET P202 has a gate terminal connected to input terminal 210, a source terminal connected to a power supply potential VDD, a drain terminal connected to node N212, and a body terminal connected to receive a back bias potential Vbp.

Inverter INV204 is a CMOS inverter including an n-channel MOSFET N204 and p-channel MOSFET P204. N-channel MOSFET N204 has a gate terminal connected to node N212, a source terminal connected to ground VSS, a drain terminal connected to node N214, and a body terminal connected to receive a back bias potential Vbn. P-channel MOSFET P204 has a gate terminal connected to node N212, a source terminal connected to a power supply potential VDD, a drain terminal connected to node N214, and a body terminal connected to receive a back bias potential Vbp.

Load L202 includes resistors (R202, R204, and R206) and capacitors (C202 and C204). Resistor R202 has a first terminal connected to node N212 and a second terminal commonly connected to a first terminal of resistor R204 and a second terminal of capacitor C202. Resistor R204 has a second terminal commonly connected to a first terminal of resistor R206 and a second terminal of capacitor C204. Resistor R206 has a second terminal connected to output terminal 220. Capacitors (C202 and C204) each have a first terminal connected to ground potential VSS.

A drawback to the conventional buffer circuit 200 is that as voltages decrease, for example, from 1 volt to 0.6 volt, the propagation delay of the clock signal can increase by a factor of 3.

Referring now to FIG. 6, a waveform diagram of simulation results is set forth. The waveform diagram of FIG. 6 illustrates the conventional buffer circuits as well as an embodiment of the present invention. In the waveform diagram of FIG. 6, signal 614 represents the clock signal CLKOUT for three series connected conventional buffer circuits 200 operating at 1.0 volts and signal 618 represents the clock signal CLKOUT for three series connected conventional buffer circuits 200 operating at 0.6 volts. As illustrated in FIG. 6, at midpoints (i.e. the trip points of a hypothetical following stage) in transitions of signal 614 and signal 618, conventional buffer circuit 200 is about 3 times slower at 0.6 volts as compared to 1.0 volts.

In view of the above, it would be desirable to provide a buffer circuit that can provide a lower signal swing voltage without substantial propagation delays. In this way, power may be reduced without the penalty of substantial propagation delays.

DETAILED DESCRIPTION OF THE EMBODIMENTS

Various embodiments of the present invention will now be described in detail with reference to a number of drawings. The embodiments show clock buffer circuits and methods constructed with insulated gate field effect transistors (IGFETs), for example IGFETs of complementary conductivity types (n-channel and p-channel types). In particular, the embodiments may include implementations using IGFETs having substantially lower absolute value of threshold voltage $V_T$, e.g. about 0.4 volts for n-channel IGFETs and about −0.4 volts for p-channel IGFETs as compared to about 0.6 volts and −0.6 volts, respectively. Such low threshold voltage IGFETs may comprise DDC technology, as but one example. DDC transistors are particularly advantageous for the embodiments herein based on the ability to reliably set threshold voltage with substantially reduced variation compared with conventional planar CMOS transistors. DDC transistors are also amenable to be designed with reduced threshold voltage, based upon, among other device design attributes, there being a heavily doped region and structure below a substantially undoped channel. Further discussion regarding transistor structure and methods of implementation is provided in U.S. Pat. No. 8,273,617 entitled ELECTRONIC DEVICES AND SYSTEMS, AND METHODS FOR MAKING AND USING THE SAME, which disclosure is incorporated by reference herein in its entirety.

Figure 1:
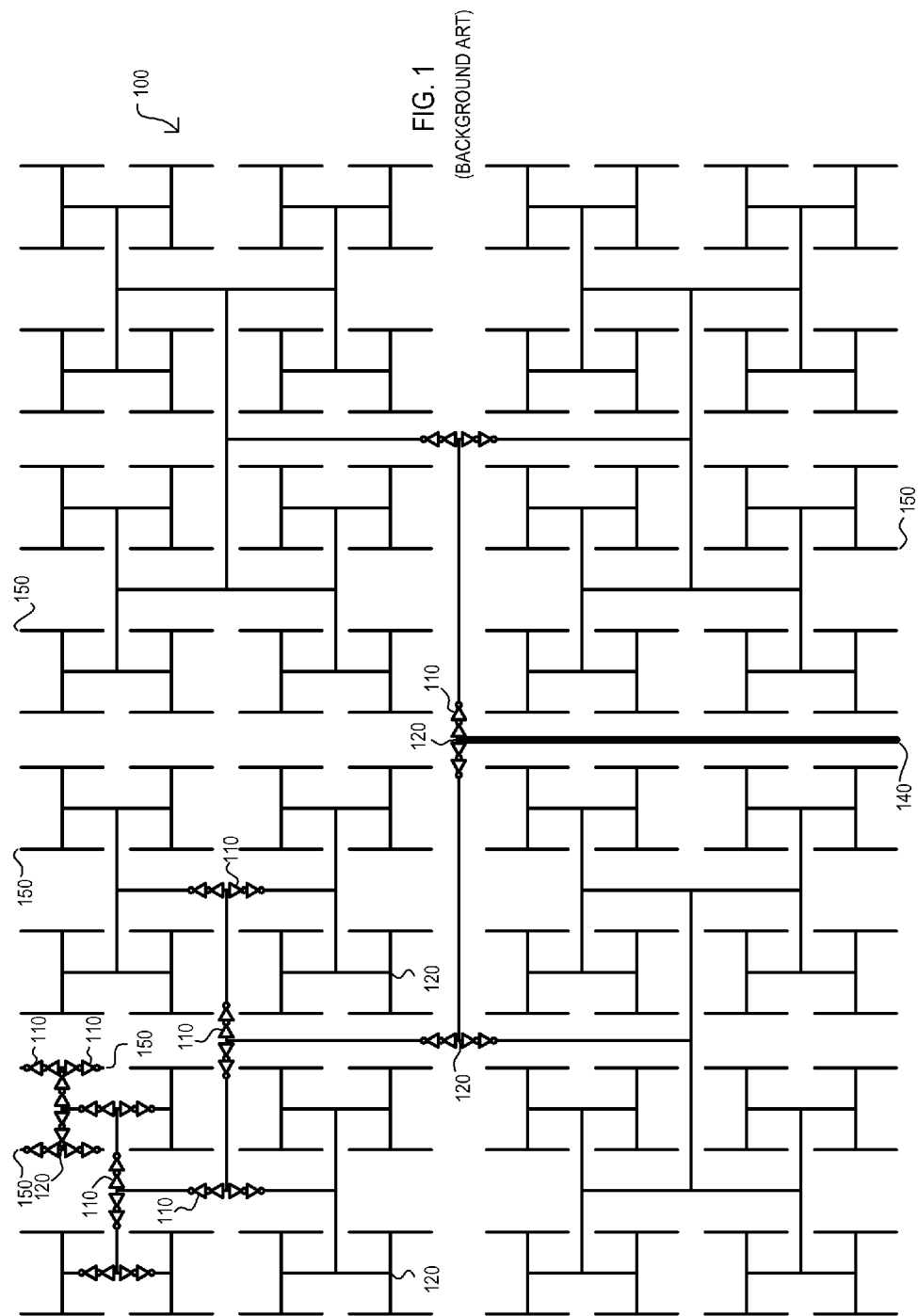
FIG. 1 is a schematic diagram of a conventional clock tree.
Figure 2:
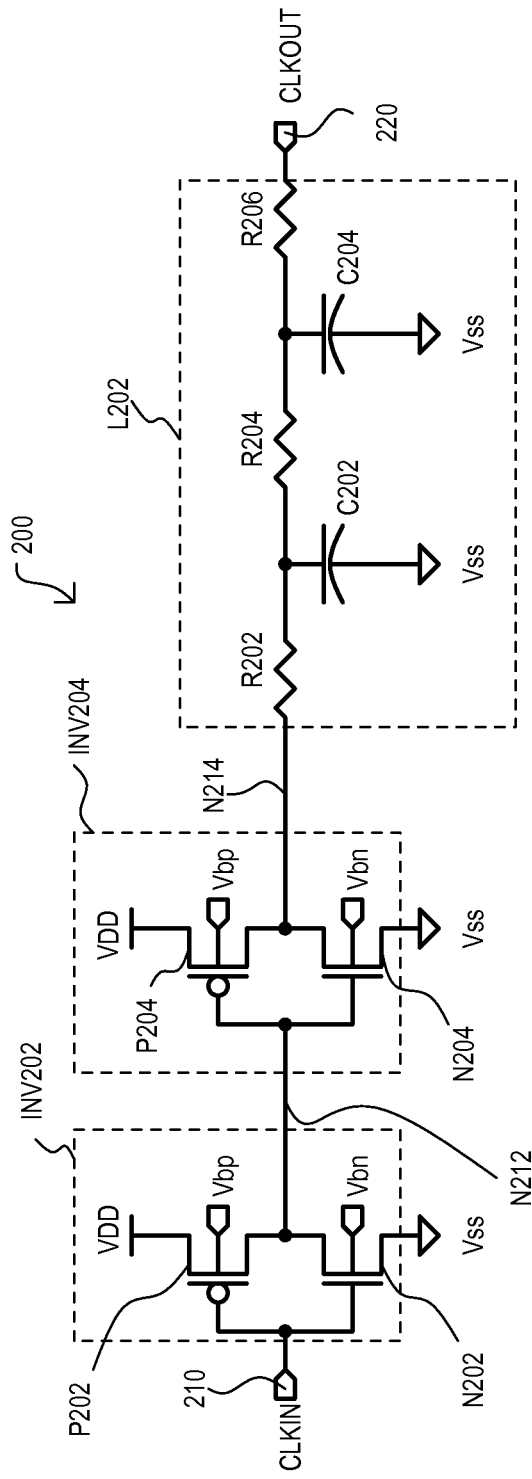
FIG. 2 is a schematic diagram of a conventional buffer circuit.
Figure 3:
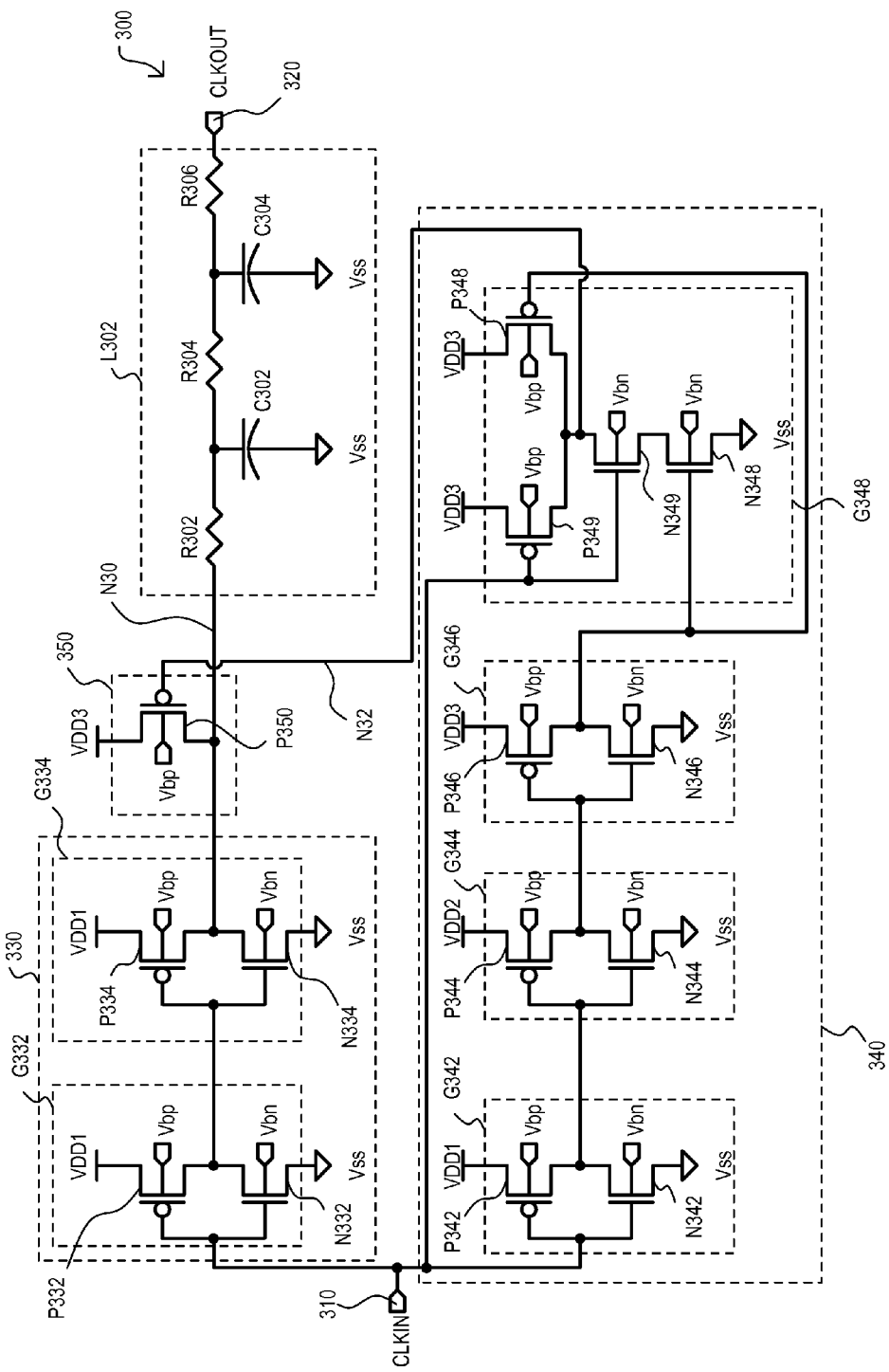
FIG. 3 is a schematic diagram of a buffer circuit according to a first embodiment.

Referring now to FIG. 3, a buffer circuit according to a first embodiment is shown in a schematic diagram, and designated by the general reference character 300. Buffer circuit 300 may receive a clock signal CLKIN at input terminal 310 and may provide a clock signal CLKOUT at output terminal 320. Buffer circuit 300 may be used as buffer circuit 110 in clock tree 100 of FIG. 1.

Buffer circuit 300 may include a low voltage drive circuit 330, a pulse generator circuit 340, and a boost drive circuit 350. Load network L302 is shown to essentially model the load of the conductive branches in the tree network of FIG. 1.

Low voltage drive circuit 330 receives clock signal CLKIN at input terminal 310 and provides an output at node N30. Pulse generator circuit 340 may receive clock signal CLKIN at input terminal 310 and may provide an output at node N32. Boost drive circuit 350 may receive the output of pulse generator circuit 340 at node N32 and may provide an output at node N30. Load L302 is connected between node N32 and output terminal 320. Input terminal 310 can be a T-junction 120 in clock tree 100 of FIG. 1 where a buffer circuit 110 and output terminal 320 can be a subsequent T-junction 120 where the next buffer circuit 110 is located, as but one example.

Low voltage drive circuit 330 may include logic gates (G332 and G334). Logic gate G332 may receive clock signal CLKIN at input terminal 310 and may provide an output to an input of logic gate G334. Logic gate G334 may provide an output to node N30. Logic gates (G332 and G334) may be inverters, as just one example.

Logic gate G332 can include an n-channel IGFET N332 and a p-channel IGFET P332. N-channel IGFET N332 may have a gate terminal commonly connected to a gate terminal of p-channel IGFET P332 to receive clock signal CLKIN. N-channel IGFET N332 may have a source terminal connected to a ground potential Vss and a drain terminal commonly connected to a drain terminal of p-channel IGFET P332 to provide an output. N-channel IGFET N332 may have a body terminal connected to a back bias potential Vbn. P-channel IGFET P332 may have a source connected to a first power supply potential VDD1. P-channel IGFET P332 may have a body terminal connected to a back bias potential Vbp.

Logic gate G334 can include an n-channel IGFET N334 and a p-channel IGFET P334. N-channel IGFET N334 may have a gate terminal commonly connected to a gate terminal of p-channel IGFET P334 to receive the output provide by commonly connected drain terminals of p-channel IGFET P332 and n-channel IGFET N332 of logic gate G332. N-channel IGFET N334 may have a source terminal connected to a ground potential Vss and a drain terminal commonly connected to a drain terminal of p-channel IGFET P334 to provide an output at node N32. N-channel IGFET N334 may have a body terminal connected to a back bias potential Vbn. P-channel IGFET P334 may have a source connected to a first power supply potential VDD1. P-channel IGFET P334 may have a body terminal connected to a back bias potential Vbp.

Pulse generator circuit 340 can include logic gates (G342, G344, G346, and G348). Logic gate G342 can receive clock signal CLKIN at input terminal 310 as an input and may provide an output. Logic gate G344 may receive the output from logic gate G342 as an input and provides an output. Logic gate G346 may receive the output from logic gate G344 and provides an output. Logic gate G348 receives clock signal CLKIN at input terminal 310 and the output from logic gate G346 as inputs and provides an output to node N32. Logic gates (G342, G344, and G346) may be inverters and logic gate G348 may be a NAND gate, as particular examples.

Logic gate G342 can include an n-channel IGFET N342 and a p-channel IGFET P342. N-channel IGFET N342 may have a gate terminal commonly connected to a gate terminal of p-channel IGFET P342 to receive clock signal CLKIN. N-channel IGFET N342 may have a source terminal connected to a ground potential Vss and a drain terminal commonly connected to a drain terminal of p-channel IGFET P342 to provide an output. N-channel IGFET N342 may have a body terminal connected to a back bias potential Vbn. P-channel IGFET P342 may have a source connected to a first power supply potential VDD1. P-channel IGFET P342 may have a body terminal connected to a back bias potential Vbp.

Logic gate G344 can include an n-channel IGFET N344 and a p-channel IGFET P344. N-channel IGFET N344 may have a gate terminal commonly connected to a gate terminal of p-channel IGFET P344 to receive the output provide by commonly connected drain terminals of p-channel IGFET P342 and n-channel IGFET N342 of logic gate G342. N-channel IGFET N344 may have a source terminal connected to a ground potential Vss and a drain terminal commonly connected to a drain terminal of p-channel IGFET P344 to provide an output. N-channel IGFET N344 may have a body terminal connected to a back bias potential Vbn. P-channel IGFET P344 may have a source connected to a second power supply potential VDD2. P-channel IGFET P344 may have a body terminal connected to a back bias potential Vbp.

Logic gate G346 can include an n-channel IGFET N346 and a p-channel IGFET P346. N-channel IGFET N346 may have a gate terminal commonly connected to a gate terminal of p-channel IGFET P346 to receive the output provide by commonly connected drain terminals of p-channel IGFET P344 and n-channel IGFET N344 of logic gate G344. N-channel IGFET N346 may have a source terminal connected to a ground potential Vss and a drain terminal commonly connected to a drain terminal of p-channel IGFET P346 to provide an output. N-channel IGFET N346 may have a body terminal connected to a back bias potential Vbn. P-channel IGFET P346 may have a source connected to a second power supply potential VDD2. P-channel IGFET P346 may have a body terminal connected to a back bias potential Vbp.

Logic gate G348 can include n-channel IGFETs (N348 and N349) and p-channel IGFETs (P348 and P349). N-channel IGFET N348 may have a gate terminal commonly connected to a gate terminal of p-channel IGFET P348 to receive the output provided by commonly connected drain terminals of p-channel IGFET P346 and n-channel IGFET N346 of logic gate G346. N-channel IGFET N348 may have a source terminal connected to a ground potential Vss and a drain terminal commonly connected to a source terminal of n-channel IGFET N349. N-channel IGFET N349 may have a gate terminal commonly connected to a gate terminal of p-channel IGFET P349 to receive clock signal CLKIN from input terminal 310. N-channel IGFET N349 may have a drain terminal commonly connected to the source terminals of P-channel IGFETs (P348 and P349) to provide an output signal to node N32. The output signal provided at node N32 may be a pulse output signal. P-channel IGFETs (P348 and P349) may each have a source terminal connected to a third power supply potential VDD3. N-channel IGFETs (N348 and N349) may each have a body terminal connected to a back bias potential Vbn. P-channel IGFETs (P348 and P349) may each have a body terminal connected to a back bias potential Vbp.

Boost drive circuit 350 can include a p-channel IGFET P350. P-channel IGFET P350 can have a source terminal connected to third power supply potential VDD3, a gate connected to receive the pulse output signal from pulse generator circuit 340 on node N32. P-channel IGFET P350 may have a drain terminal connected to provide an output at node N30. P-channel IGFET P350 may have a body terminal connected to a back bias potential Vbp.

Load network L302 includes resistors (R302, R304, and R306) and capacitors (C302 and C304). Resistor R302 has a first terminal connected to node N30 and a second terminal commonly connected to a first terminal of resistor R304 and a second terminal of capacitor C302. Resistor R304 has a second terminal commonly connected to a first terminal of resistor R306 and a second terminal of capacitor C304. Resistor R306 has a second terminal connected to output terminal 320. Capacitors (C302 and C304) each have a first terminal connected to ground potential VSS.

First power supply potential VDD1 may be about 0.6 volts, second power supply potential VDD2 may be about 0.8 volts, and third power supply potential VDD3 may be about 1.0 volts.

The operation of buffer circuit 330 will now be explained. The operation will be described through one full cycle of clock signal CLKIN beginning with clock signal CLKIN at a low logic level.

Initially, clock signal CLKIN may be at a low logic level. Logic gate G332 in low voltage drive circuit 330 can receive the low logic level and provide a high logic level (at a first power supply potential VDD1) to the input of logic gate G334. With the input of logic gate G334 at a high logic level, logic gate G334 may provide a low logic level to node N32. This low logic level will propagate through load network L302 to provide a clock signal CLKOUT at a low logic level. Also at this time, pulse generator circuit 340 receives the clock signal CLKIN as inputs to logic gates (G342 and G348). Under this condition, the output of logic gate G342 is a high logic level. With the output of logic gate G342 at a high logic level (at a first power supply potential VDD1), the output of logic gate G344 is a low logic level and the output of logic gate G346 is a high logic level. With the output of logic gate G346 at a high logic level, N-channel IGFET N348 in logic gate G348 is turned on and P-channel IGFET P348 is turned off. Also, at this time, with clock signal CLKIN at a low logic level, p-channel IGFET P349 can be turned on and n-channel IGFET N349 is turned off. With P-channel IGFET P349 turned on, pulse generator circuit 340 provides a logic high signal to node N32. With node N32 at a logic high level (at a third power supply potential VDD3), p-channel IGFET P350 in boost drive circuit 350 is turned off.

Next, as clock signal CLKIN transitions from a low logic level to a high logic level, logic gate G332 can provide an output that transitions from a high logic level to a low logic level. At this time, n-channel IGFET N334 in logic gate G334 of low voltage drive circuit 330 can turn off and n-channel IGFET P334 may turn on. In this way, node N30 may be electrically connected to first power supply potential VDD1 and may begin to rise. It is noted that load network L302 may prevent node N30 and subsequently clock signal CLKOUT from instantaneously rising to a high logic level. However, also at this time, logic gate 348 receives the low to high logic level transitioning clock signal CLKIN. As clock signal transitions from the low to high logic levels, p-channel IGFET P349 turns off and n-channel IGFET N349 turns on in logic gate 348. As noted earlier, at this time n-channel IGFET N348 is turned on. With n-channel IGFETs (N348 and N349) turned on, node N32 transitions from a logic high level to a logic low level. In this way, p-channel IGFET P350 in boost drive circuit 350 turns on and provides low impedance path from node N30 to third power supply potential VDD3.

With third power supply potential VDD3 at a potential (1 volt), the clock line modeled by load network L302 can be driven to a desired potential (in this case about 0.6 volts) via a boost drive circuit 350 operating at a higher potential and the transition time of clock signal CLKOUT may be greatly decreased.

Also, at this time, the low to high transitioning clock signal CLKIN can propagate through logic gates (G342, G344, and G346) of pulse generating circuit 340. As clock signal CLKIN transitions to a high logic level, the output of logic gate G342 transitions to a low logic level. With the output of logic gate G342 at a low logic level, the output of logic gate G344 transitions to a high logic level (second supply potential VDD2). With the output of logic gate G344 at a high logic level, the output of logic gate G346 transitions to a low logic level. It is noted that the propagation time of a clock signal CLKIN through logic gates (G342, G344, and G346) can be set to a predetermined time. Thus, after this predetermined time after clock signal CLKIN transitions to a high logic level, logic gate G348 in pulse generator circuit 340 receives the low logic level from logic gate G346. Upon receiving the low logic level from logic gate G348, n-channel IGFET N348 turns off and p-channel IGFET P348 turns on. With p-channel IGFET P348 turned on, node N32 transitions back to a high logic level (third supply potential VDD3). With node N32 at a high logic level, p-channel IGFET P350 in boost drive circuit 350 turns off thereby providing a high impedance path between load L302 and third power supply potential VDD3.

It is noted that it may be preferable to set the predetermined propagation time for the clock signal CLKIN to propagate through logic gates (G342, G344, and G346) to provide a pulse width for the output pulse provided on node N32 by pulse generating circuit to a time sufficient to allow boost drive circuit 350 to provide the low impedance path to third power supply potential VDD3 to essentially provide a high logic level of about 0.6 volts to clock signal CLKOUT without substantially overshooting the desired high logic level of about 0.6 volts. In this way, clock signal transition time may be minimized without unduly wasting charge.

After p-channel IGFET P350 in boost drive circuit 350 is turned off, p-channel IGFET P334 in logic gate G334 of low voltage drive circuit 330 can remain on to provide a low impedance path between load L302 and first power supply potential VDD1. In this way, low voltage drive circuit may correct any overshoot or undershoot of the desired high logic potential of about 0.6 volts and act as a low current keeper of the desired about 0.6 volts.

After a time, clock signal CLKIN can transition from the high logic level to a low logic level. In response to the high to low logic level transition of clock signal CLKIN, the output of logic gate G332 of low voltage drive circuit 330 transitions from a low logic level to a high logic level (first power supply potential VDD1). In response to the low to high logic level transition of the output of logic gate G332, n-channel IGFET N334 of logic gate G334 turns on and p-channel IGFET P334 turns off. In this way, a low impedance path is provided from the load L302 to ground potential Vss through n-channel IGFET N334 and clock signal CLKOUT may be driven back to a low logic level.

Also at this time, in response to clock signal CLKIN transitioning from the high logic level to a low logic level, p-channel IGFET P349 in logic gate G348 in pulse generator circuit 340 turns on and n-channel IGFET N349 turns off. In this way, the high logic level (third power supply potential VDD3) is maintained on node N32. A short time later, the clock signal CLKIN propagates through the logic gates (G342, G344, and G346) and the output of logic gate G346 transitions from a low logic level to a high logic level (third power supply potential VDD3). At this time n-channel IGFET N348 turns back on and p-channel IGFET 348 turns back off to return to the original conditions and one full clock cycle has occurred.

The pulse generated on node N32 can have a first edge and a second edge. The boost drive circuit may provide a low impedance path between the third power supply potential VDD3 and node N30 in response to the first edge and may provide a high impedance path between the third power supply potential VDD3 and node N30 in response to the second edge.

The commonly connected gates of p-channel IGFET P332 and n-channel IGFET N332 in low voltage drive circuit 330 may be a low voltage drive circuit input terminal. The commonly connected gates of p-channel IGFET P342 and n-channel IGFET N342 in pulse generator circuit 340 may be a pulse generator circuit input terminal. The gate of p-channel IGFET P350 in boost drive circuit 350 may be a boost drive circuit input terminal.

Figure 4:
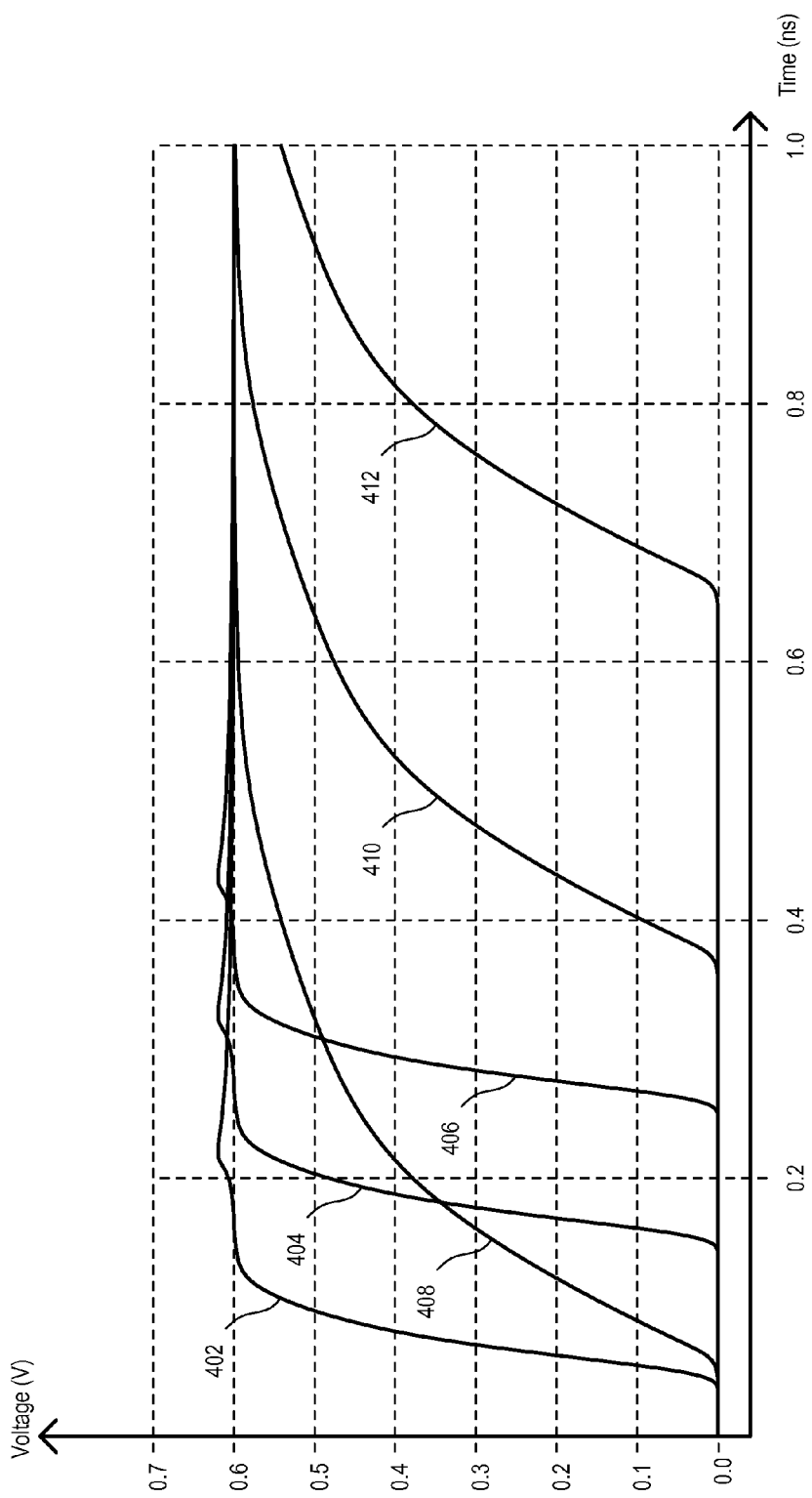
FIG. 4 is a waveform diagram of simulation results.

Referring now to FIG. 4, a waveform diagram of simulation results is set forth. The waveform diagram of FIG. 4 illustrates simulation results of three buffer circuits 300 connected in series, as well as simulation results of three conventional buffer circuits 200 connected in series having a power supply potential VCC of 0.6 volt.

Waveform 402 represents clock signal CLKOUT after a first stage of buffer circuit 300, waveform 404 represents clock signal CLKOUT after a second stage of buffer circuit 300, and waveform 406 represents clock signal CLKOUT after a third stage of buffer circuit 300. Waveform 408 represents clock signal CLKOUT after a first stage of conventional buffer circuit 200, waveform 410 represents clock signal CLKOUT after a second stage of conventional buffer circuit 200, and waveform 412 represents clock signal CLKOUT after a third stage of conventional buffer circuit 200.

As illustrated in FIG. 4, at midpoints (i.e. the trip points of a following stage) in transitions of waveform 406 and waveform 412, buffer circuit 300 is about 3 times faster than conventional buffer circuit 200.

Figure 5:
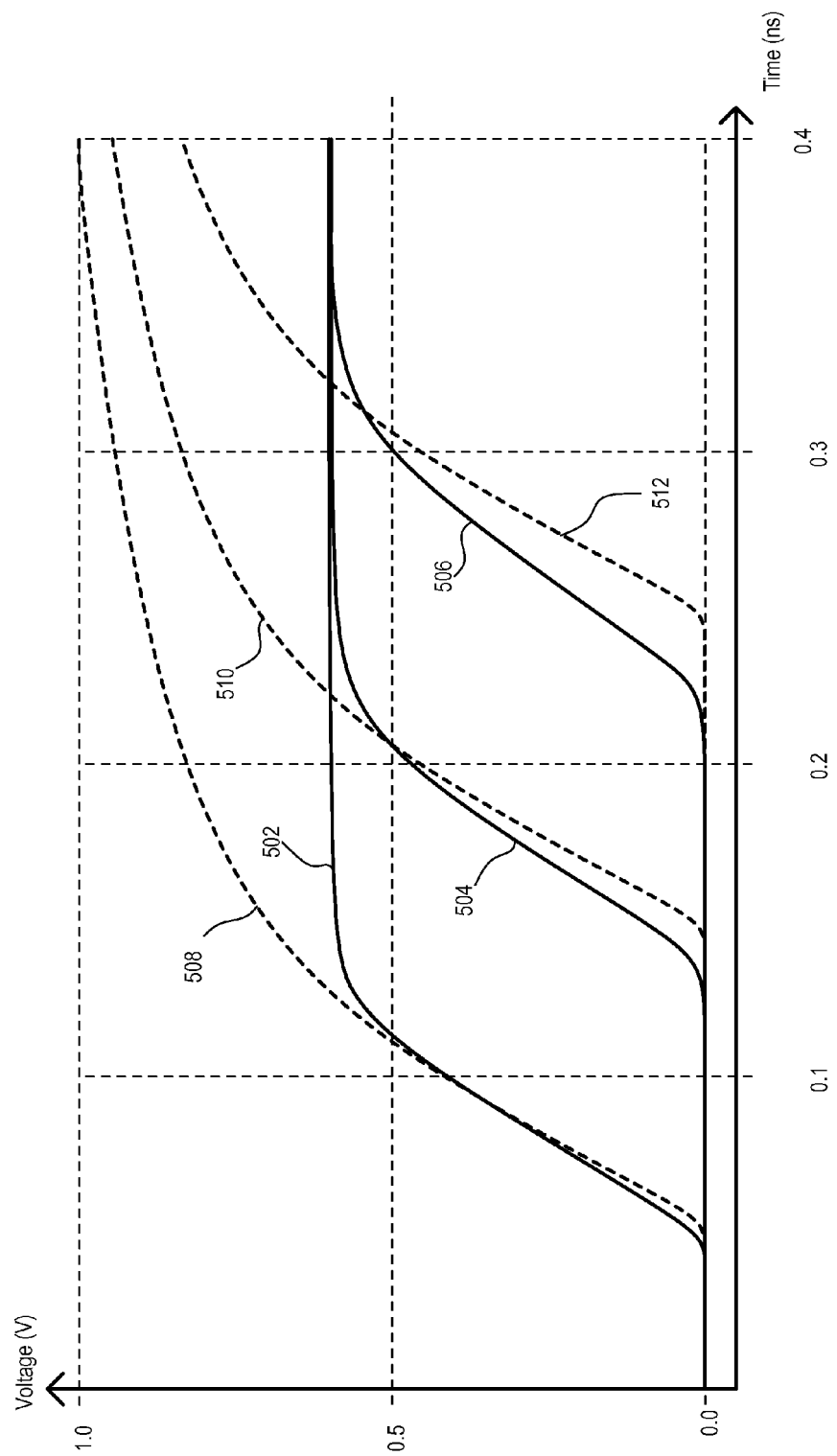
FIG. 5 is a waveform diagram of simulation results.

Referring now to FIG. 5, a waveform diagram of simulation results is set forth. The waveform diagram of FIG. 5 illustrates simulation results of three buffer circuits 300 connected in series, as well as simulation results of three conventional buffer circuits 200 connected in series having a power supply potential VCC of 1.0 volt.

Waveform 502 represents clock signal CLKOUT after a first stage of buffer circuit 300, waveform 504 represents clock signal CLKOUT after a second stage of buffer circuit 300, and waveform 506 represents clock signal CLKOUT after a third stage of buffer circuit 300. Waveform 508 represents clock signal CLKOUT after a first stage of conventional buffer circuit 200, waveform 510 represents clock signal CLKOUT after a second stage of conventional buffer circuit 200, and waveform 512 represents clock signal CLKOUT after a third stage of conventional buffer circuit 200.

As illustrated in FIG. 5, at midpoints (i.e. the trip points of a following stage) in transitions of waveform 506 and waveform 512, buffer circuit 300 is about ten percent faster than conventional buffer circuit 200.

Figure 6:
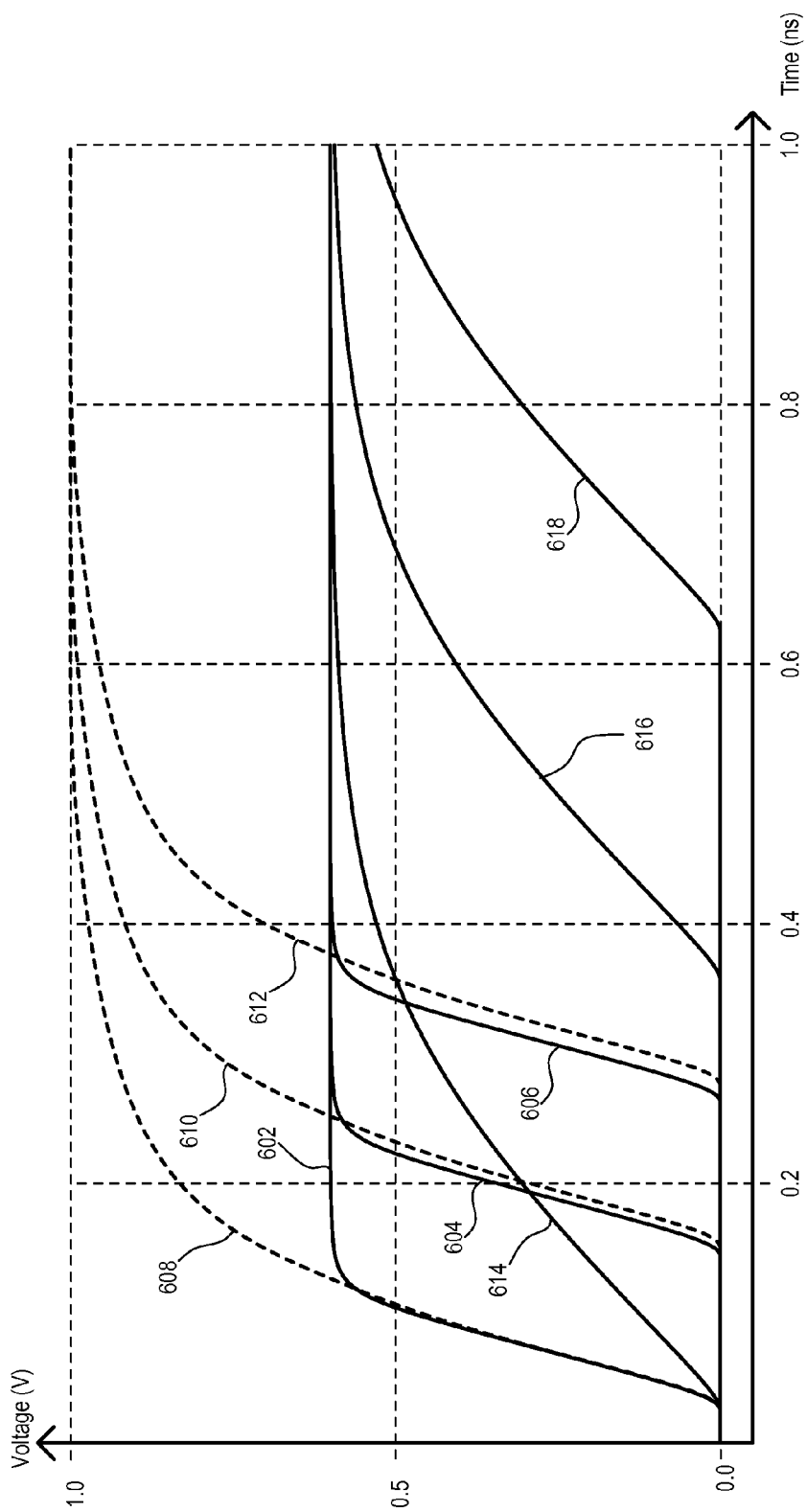
FIG. 6 is a waveform diagram of simulation results.

Referring now to FIG. 6, a waveform diagram of simulation results is set forth. The waveform diagram of FIG. 6 illustrates simulation results of three buffer circuits 300 connected in series, as well as simulation results of three conventional buffer circuits 200 connected in series having a power supply potential VCC of 0.6 volt, and simulation results of three conventional buffer circuits 200 connected in series having a power supply potential VCC of 0.6 volt.

Waveform 602 represents clock signal CLKOUT after a first stage of buffer circuit 300, waveform 604 represents clock signal CLKOUT after a second stage of buffer circuit 300, and waveform 606 represents clock signal CLKOUT after a third stage of buffer circuit 300. Waveform 608 represents clock signal CLKOUT after a first stage of conventional buffer circuit 200 operating at a power supply potential VCC of 1.0 volt, waveform 610 represents clock signal CLKOUT after a second stage of conventional buffer circuit 200 operating at a power supply potential VCC of 1.0 volt, and waveform 612 represents clock signal CLKOUT after a third stage of conventional buffer circuit 200 operating at a power supply potential VCC of 1.0 volt. Waveform 614 represents clock signal CLKOUT after a first stage of conventional buffer circuit 200 operating at a power supply potential VCC of 0.6 volt, waveform 616 represents clock signal CLKOUT after a second stage of conventional buffer circuit 200 operating at a power supply potential VCC of 0.6 volt, and waveform 618 represents clock signal CLKOUT after a third stage of conventional buffer circuit 200 operating at a power supply potential VCC of 0.6 volt.

Figure 7:
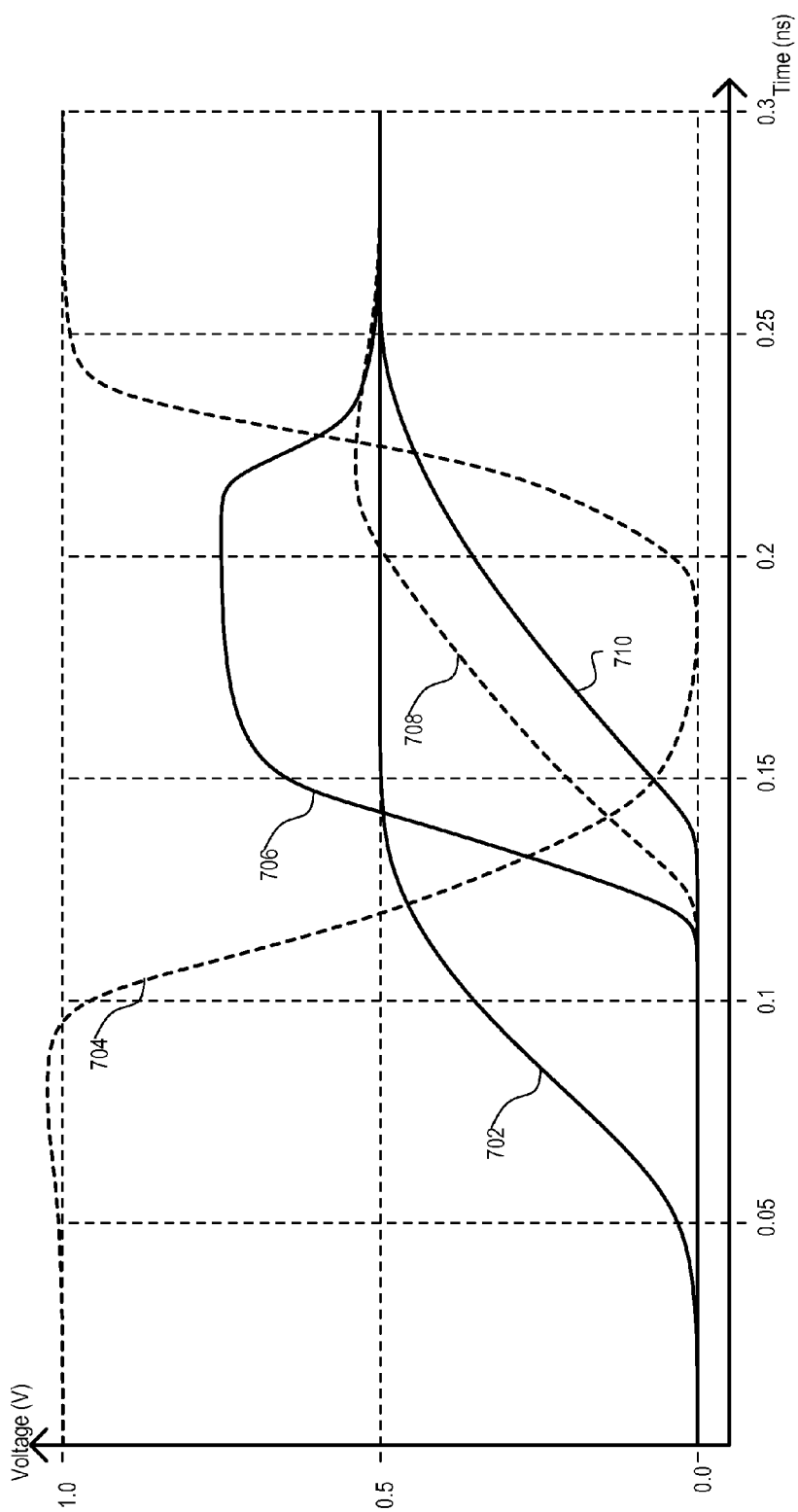
FIG. 7 is a waveform diagram of simulation results.

Referring now to FIG. 7, a waveform diagram of simulation results is set forth. The waveform diagram of FIG. 7 illustrates simulation results buffer circuit 300 of FIG. 3.

Waveform 702 represents clock signal CLKIN. Waveform 704 represents the pulse generated at node N32. Waveform 706 represents the output signal at node N30 at the input to load L302. Waveform 708 represents the output signal at the commonly connected node of resistors (R302 and R304) and capacitor C302 in load L302. Waveform 710 represents clock signal CLKOUT.

As illustrated in FIG. 7, an overshoot may occur at node N30 (waveform 706), however, charge sharing across the load L302 may attenuate the signal to produce a clock signal CLKIN at about 0.6 volt, which is the target.

Also, as illustrated in FIG. 7, the negative pulse generated at node N32 (waveform 704) transitions from 1 volt to 0 volt (i.e. ground potential) and thus provides a ground potential VSS to a gate terminal of p-channel IGFET P350 which has a source terminal connected to the third supply potential (about 1.0 volt). In this way, boost drive circuit 350 provides a greater current drive to achieve the huge speed improvement as compared to the conventional buffer circuit 200 operating at 0.6 volt.

The pulse width at node N32 (waveform 704) may be designed to provide a predetermined pulse width such that clock signal CLKOUT may be provided having a magnitude of about 0.6 volt. This may be achieved by designing gates (G342, G344, and G346) to provide a predetermined propagation delay. Gates (G342, G344, and G346) may be conceptualized as a delay stage providing a predetermined delay.

Figure 8:
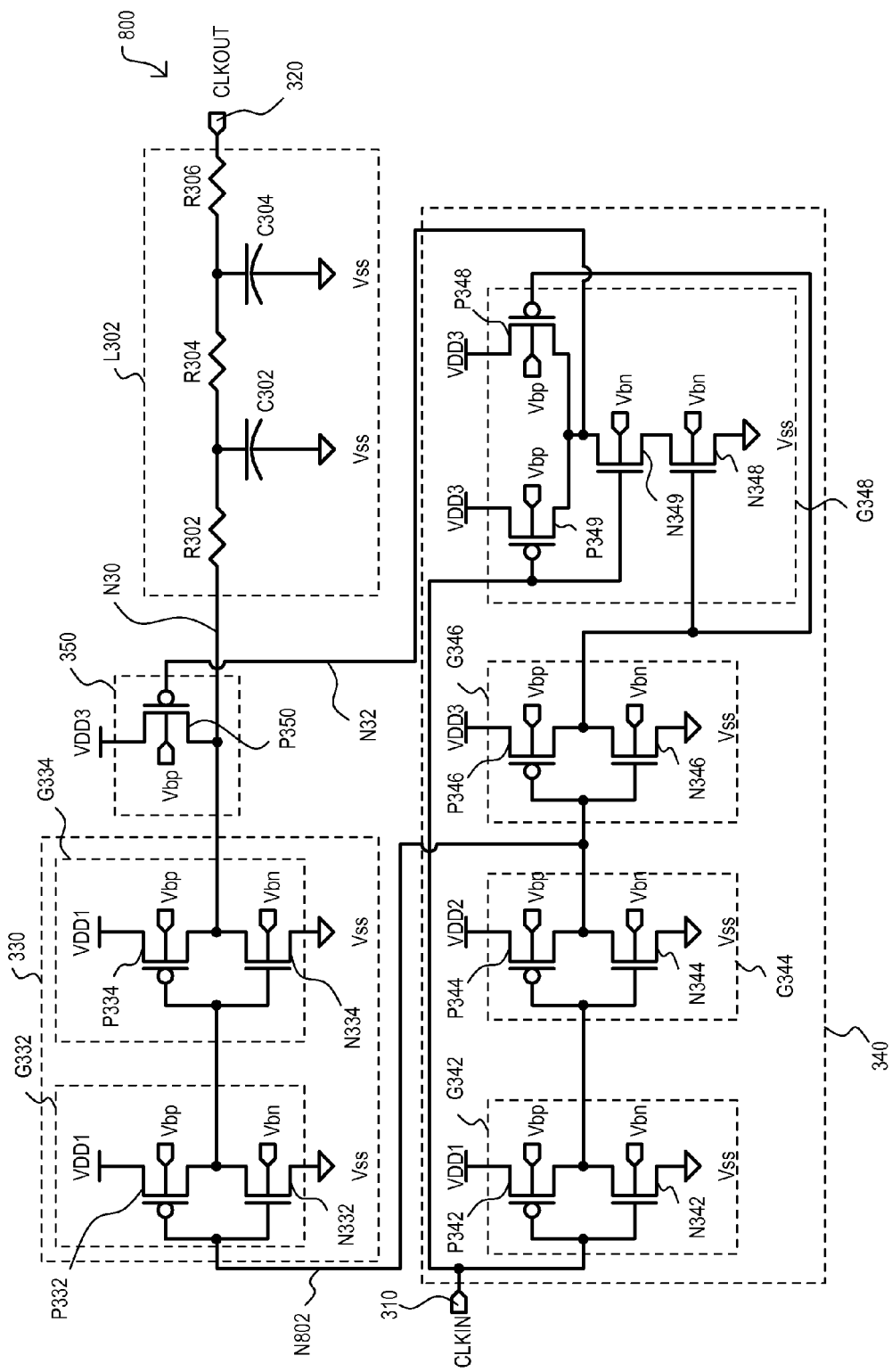
FIG. 8 is a schematic diagram of a buffer circuit according to an embodiment.

Referring now to FIG. 8, a buffer circuit according to another embodiment is shown in a schematic diagram, and designated by the general reference character 800. Buffer circuit 800 may be used as buffer circuit 110 in clock tree 100 of FIG. 1.

Buffer circuit 800 may include essentially the same constituents as buffer circuit 300 of FIG. 3. Buffer circuit 800 may differ from buffer circuit 300 in that low voltage drive circuit 330 may receive the output provided by gate G344 in pulse generator circuit 340 at node N802 as an input instead of clock signal CLKIN. In this way, p-channel IGFET P334 may be delayed in turning on and a current path between the boost drive circuit 350 and low voltage drive circuit 330 may be reduced or eliminated. Conceptually, in buffer circuit 800, low drive circuit 330 may receive a delayed clock signal as an input at node N802. Delayed clock signal may be provided by delaying clock signal CLKIN with a first predetermined propagation delay of gates (G342 and G344) in pulse generator circuit 340. The pulse width of pulse signal at node N32 may be determined by a second predetermined propagation delay of gates (G342, G444, and G346).

Node N802 can be conceptualized as a low voltage drive circuit input terminal and gates (G342 and G344) can be conceptualized as a delay circuit that provides a delayed clock signal to the low voltage drive circuit input terminal (node N802).

The appearance of the phrase "in one embodiment" in various places in the specification do not necessarily all refer to the same embodiment. The term "to couple" or "electrically connect" as used herein may include both to directly and to indirectly connect through one or more intervening components. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Accordingly, the specifications and drawings are to be regarded in an illustrative rather than a restrictive sense.

What is claimed is:

1. A buffer circuit, comprising:
a low voltage drive circuit operating at a first supply potential, the low voltage drive circuit coupled to receive a clock input signal at a low voltage drive circuit input terminal and directly connected to provide a clock output signal at an output node; and
a boost drive circuit operating at a second supply potential greater than the first supply potential, the boost drive circuit coupled to receive a pulse signal and provide a low impedance path between the second supply potential and the output node in response to the pulse signal to drive the output node.

2. The buffer circuit of claim 1, wherein
the boost drive circuit includes a first p-channel insulated gate field effect transistor (IGFET) having a source terminal coupled to the second power supply potential, a drain terminal coupled to the output node, and a gate terminal coupled to receive the pulse signal, the IGFET further including a heavily doped region and structure below a substantially undoped channel and the first supply potential is less than or equal to about 0.6 volt.

3. The buffer circuit of claim 2, further including:
a pulse generator circuit coupled to receive the clock input signal and provide the pulse signal.

4. The buffer circuit of claim 3, wherein:
the pulse signal has a predetermined pulse width having a first edge that enables the boost drive circuit to provide the low impedance path and a second edge that disables the low impedance path when a load coupled to the output node is charged to about the first supply potential.

5. The buffer circuit of claim 3, wherein:
the pulse generator circuit provides a propagation delay path for the clock input signal, the propagation delay path essentially sets the predetermined pulse width.

6. The buffer circuit of claim 5, wherein:
the propagation delay path includes first, second, and third logic gates coupled in series, the first logic gate operates at the first supply potential, the third logic gate operates at the second supply potential, and the second logic gate operates at a third supply potential, the third supply potential has a potential between the first supply potential and the second supply potential.

7. The buffer circuit of claim 3, wherein:
the pulse generator circuit includes a delay circuit coupled between the clock input signal and the low voltage drive circuit input terminal, the delay circuit is coupled to receive the clock input signal and provide a delayed clock signal to the low voltage drive input terminal.

8. The buffer circuit of claim 1, wherein:
the pulse signal has a first logic level at essentially the second supply potential and a second logic level at essentially a ground potential, the boost drive circuit provides the low impedance path between the second supply potential and the output node in response to the pulse signal being at the second logic level and provides a high impedance path between the second supply potential and the output node in response to the pulse signal being at the first logic level.

9. A buffer circuit, comprising:
a low voltage drive circuit operating at a first supply potential, the low voltage drive circuit coupled to receive an input signal at a low voltage drive circuit input terminal and directly connected to provide an output signal at an output node;
a boost drive circuit operating at a second supply potential greater than the first supply potential, the boost drive circuit coupled to receive a pulse signal at a boost drive circuit input terminal and provide a low impedance path between the second supply potential and the output node in response to the pulse signal to drive the output node; and
a pulse generator circuit coupled to receive the input signal at a pulse generator circuit input terminal and provide the pulse signal.

10. The buffer circuit of claim 9, wherein:
the boost drive circuit includes a first p-channel insulated gate field effect transistor (IGFET) having a source terminal coupled to the second power supply potential, a drain terminal coupled to the output node, and a gate terminal coupled to the boost drive circuit input terminal, wherein the IGFET is comprised of a transistor having a substantially undoped channel with a heavily doped region a distance below the surface, the heavily doped region being of a dopant level sufficient to set the depletion width for the IGFET when a voltage is applied to the gate and the first supply potential is less than or equal to about 0.6 volt.

11. The buffer circuit of claim 9, wherein:
the input signal is a clock signal.

12. The buffer circuit of claim 9, wherein:
the low voltage drive circuit includes
a first low voltage drive circuit logic gate having an input coupled to the low voltage drive circuit input terminal; and
a second low voltage drive circuit logic gate having an input coupled to receive an output from the first low voltage drive circuit logic gate, the second low voltage drive circuit logic gate has an output coupled to the output node.

13. The buffer circuit of claim 12, wherein:
the first and second low voltage drive circuit logic gates are inverters.

14. The buffer circuit of claim 9, wherein:
the pulse generator circuit includes
- a first delay stage, the first delay stage has an input coupled to the pulse generator input terminal; and
- a pulse generator circuit logic gate operating at the second supply potential, the pulse generator circuit logic gate has a first input coupled to the pulse generator input terminal and a second input coupled to receive an output from the first delay stage and coupled to provide the pulse signal.

15. The buffer circuit of claim 14, wherein:
the pulse generator circuit logic gate is a NAND logic gate.

16. The buffer circuit of claim 14, wherein:
the pulse signal has a predetermined pulse width having a first edge that enables the boost drive circuit to provide the low impedance path and a second edge that disables the low impedance path when a load coupled to the output node is charged to about the first supply potential.

17. The buffer circuit of claim 16, wherein:
the first delay stage provides a propagation delay path for the input signal, the propagation delay path essentially sets the predetermined pulse width.

18. The buffer circuit of claim 17, wherein:
the first delay stage further includes
- a first delay stage logic gate operating at the first supply potential, the first delay stage logic gate has an input coupled to the pulse generator circuit input terminal;
- a second delay stage logic gate operating at a third supply potential, the second delay stage logic gate has an input coupled to an output of the first delay stage logic gate;
- a third delay stage logic gate operating at the second supply potential, the third delay stage logic gate has an input coupled to an output of the second delay stage logic gate and an output coupled to the second input terminal of the pulse generator circuit logic gate; and
- the third supply potential is greater than the first supply potential and less than the second supply potential.

19. The buffer circuit of claim 18, wherein:
the first, second, and third delay stage logic gates are inverters.

20. The buffer circuit of claim 18, wherein:
the low voltage drive circuit is coupled to receive the output of the second delay stage logic gate at the low voltage drive circuit input terminal.

\* \* \* \* \*